US010679916B2

(12) United States Patent
Horibe et al.

(10) Patent No.: US 10,679,916 B2
(45) Date of Patent: *Jun. 9, 2020

(54) CIRCUIT MODULE AND MANUFACTURING METHOD THEREOF

(71) Applicant: International Business Machines Corporation, Armonk, NY (US)

(72) Inventors: Akihiro Horibe, Kanagawa (JP); Sayuri Hada, Kanagawa (JP); Kuniaki Sueoka, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 106 days.

This patent is subject to a terminal disclaimer.

(21) Appl. No.: 16/110,389

(22) Filed: Aug. 23, 2018

(65) Prior Publication Data

US 2018/0366388 A1  Dec. 20, 2018

Related U.S. Application Data

(63) Continuation of application No. 14/927,989, filed on Oct. 30, 2015, now Pat. No. 10,074,583.

(30) Foreign Application Priority Data

Nov. 17, 2014 (JP) .................................. 2014-232283

(51) Int. Cl.
   *H01L 23/31* (2006.01)
   *H01L 23/498* (2006.01)
   (Continued)

(52) U.S. Cl.
   CPC ........ *H01L 23/3157* (2013.01); *H01L 21/561* (2013.01); *H01L 21/563* (2013.01);
   (Continued)

(58) Field of Classification Search
   CPC ..... H01L 21/561; H01L 21/563; H01L 21/78; H01L 21/782; H01L 21/784;
   (Continued)

(56) References Cited

U.S. PATENT DOCUMENTS 5,641,997 A  6/1997 Ohta et al.
6,030,854 A  2/2000 Mashimoto et al.
(Continued)

FOREIGN PATENT DOCUMENTS

JP  2001053109  2/2001
JP  2001250843  9/2001
(Continued)

OTHER PUBLICATIONS

Non-final Office Action for U.S. Appl. No. 14/927,989 dated Jun. 14, 2016 Jun. 14, 2016.
(Continued)

*Primary Examiner* — Bryan R Junge
(74) *Attorney, Agent, or Firm* — Fleit Intellectual Property Law; Thomas S. Grzesik

(57) ABSTRACT

There is provided a circuit module where a sufficient amount of underfill resin may be supplied to corner portions of a semiconductor chip. A circuit module includes a circuit board provided with a plurality of electrode pads on a surface of the board, a semiconductor chip arranged on the board, the chip including a surface and a back surface, where each of a plurality of solder bumps and provided on the back surface is solder joined to a corresponding one of the plurality of electrode pads, and an underfill provided between the surface of the board and the back surface of the chip. Furthermore, the chip includes an eaves portion of a predetermined thickness at an outer periphery of the surface,
(Continued)

and the underfill forms a fillet extending from a bottom surface of the eaves portion to the surface of the board along a side wall of the chip.

20 Claims, 5 Drawing Sheets

(51) Int. Cl.
   *H01L 21/56* (2006.01)
   *H01L 21/78* (2006.01)
   *H01L 23/00* (2006.01)
   *H01L 21/683* (2006.01)
   *H01L 29/06* (2006.01)

(52) U.S. Cl.
   CPC ...... *H01L 21/6835* (2013.01); *H01L 21/6836* (2013.01); *H01L 21/78* (2013.01); *H01L 23/3178* (2013.01); *H01L 23/49811* (2013.01); *H01L 24/27* (2013.01); *H01L 24/94* (2013.01); *H01L 29/0657* (2013.01); *H01L 24/16* (2013.01); *H01L 24/29* (2013.01); *H01L 24/32* (2013.01); *H01L 24/81* (2013.01); *H01L 24/83* (2013.01); *H01L 2221/68327* (2013.01); *H01L 2221/68381* (2013.01); *H01L 2224/16227* (2013.01); *H01L 2224/26145* (2013.01); *H01L 2224/27002* (2013.01); *H01L 2224/27013* (2013.01); *H01L 2224/2929* (2013.01); *H01L 2224/29082* (2013.01); *H01L 2224/29386* (2013.01); *H01L 2224/29499* (2013.01); *H01L 2224/32225* (2013.01); *H01L 2224/73104* (2013.01); *H01L 2224/73204* (2013.01); *H01L 2224/8185* (2013.01); *H01L 2224/81191* (2013.01); *H01L 2224/81447* (2013.01); *H01L 2224/81815* (2013.01); *H01L 2224/83191* (2013.01); *H01L 2224/83862* (2013.01); *H01L 2224/9211* (2013.01); *H01L 2224/94* (2013.01); *H01L 2924/10156* (2013.01)

(58) Field of Classification Search
   CPC ......... H01L 21/82–8258; H01L 23/295; H01L 2224/13553; H01L 2224/13582; H01L 2224/1369; H01L 2224/13691; H01L 2224/13698; H01L 2224/13699; H01L 2224/1379; H01L 2224/13791; H01L 2224/8085–80885; H01L 2224/8185–81885; H01L 2224/8285–82885; H01L 2224/8385–83885; H01L 2224/8685–86885

See application file for complete search history.

(56) References Cited

U.S. PATENT DOCUMENTS

| | | | |
|---|---|---|---|
| 6,768,209 | B1 | 7/2004 | Jiang et al. |
| 6,774,493 | B2 | 8/2004 | Capote et al. |
| 7,301,222 | B1 | 11/2007 | Patwardhan et al. |
| 7,745,264 | B2 | 6/2010 | Zhai et al. |
| 7,846,769 | B2 | 12/2010 | Lii et al. |
| 8,007,627 | B2 | 8/2011 | Nishida et al. |
| 10,074,583 | B2 * | 9/2018 | Horibe .............. H01L 24/94 |
| 2006/0284285 | A1 | 12/2006 | Fukazawa |
| 2007/0117277 | A1 | 5/2007 | Akram |
| 2009/0011543 | A1 | 1/2009 | Karta et al. |
| 2010/0032190 | A1 | 2/2010 | Yamaguchi et al. |
| 2012/0313224 | A1 | 12/2012 | Fukuda et al. |
| 2013/0119533 | A1 | 5/2013 | Chen et al. |
| 2013/0299986 | A1 | 11/2013 | Sun et al. |
| 2014/0346684 | A1 | 11/2014 | Kojima |

FOREIGN PATENT DOCUMENTS

| | | |
|---|---|---|
| JP | 2004179590 | 6/2004 |
| JP | 2005538572 | 12/2005 |
| JP | 2009263611 | 11/2009 |
| WO | 2011129272 | 10/2011 |

OTHER PUBLICATIONS

Notice of Allowance for U.S. Appl. No. 14/927,989 dated May 7, 2018.

Non-final Office Action for U.S. Appl. No. 14/927,989 dated Jun. 22, 2017 Jun. 22, 2018.

Final Office Action for U.S. Appl. No. 14/927,989 dated Sep. 26, 2017 Sep. 26, 2017.

Final Office Action for U.S. Appl. No. 14/927,989 dated Dec. 21, 2016 Dec. 21, 2016.

* cited by examiner

[Figure 1]
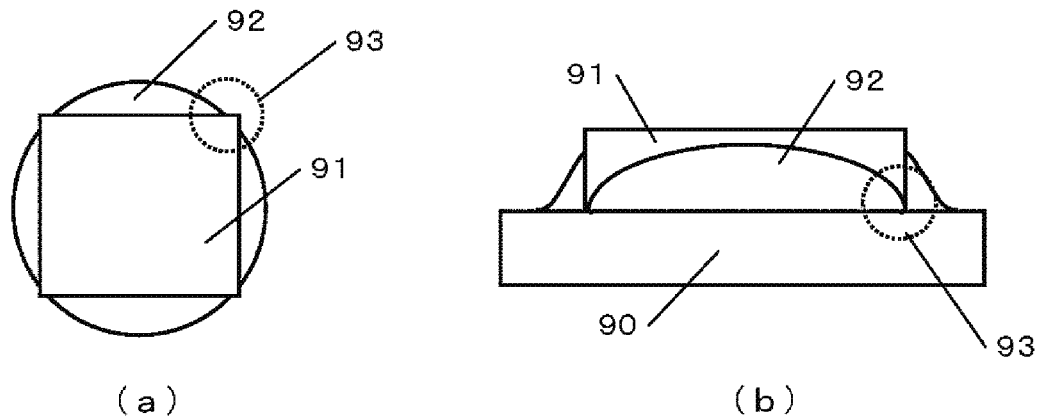
[Figure 2]
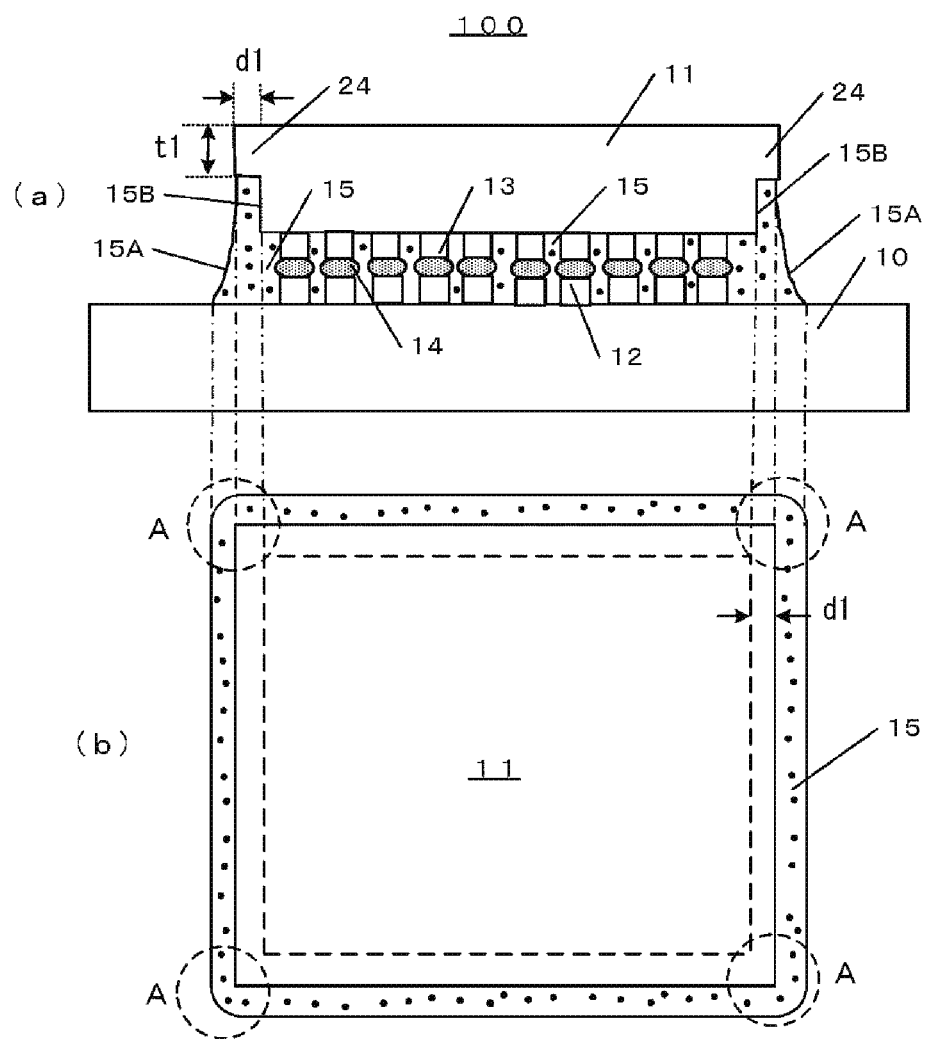

[Figure 3]
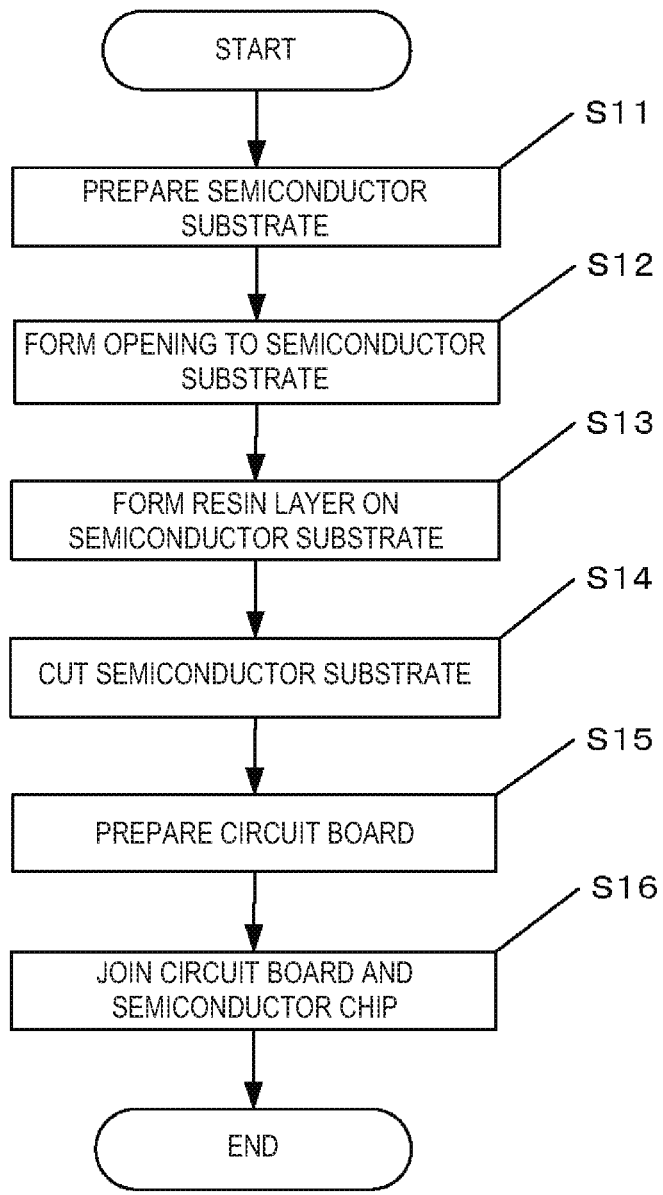
[Figure 4]
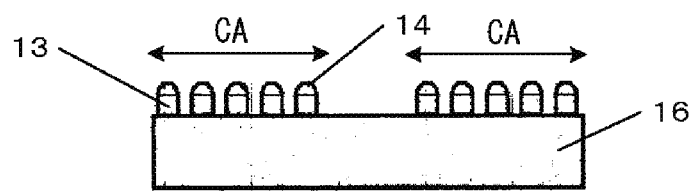

[Figure 5]
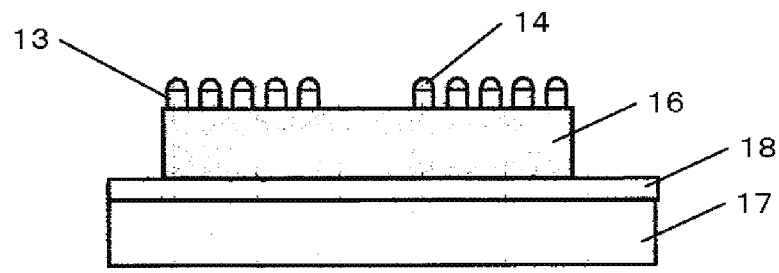
[Figure 6]
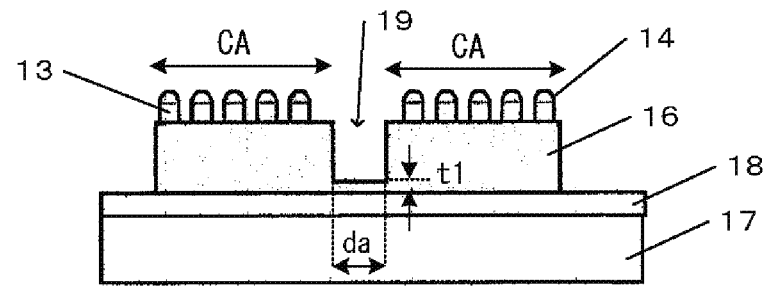
[Figure 7]
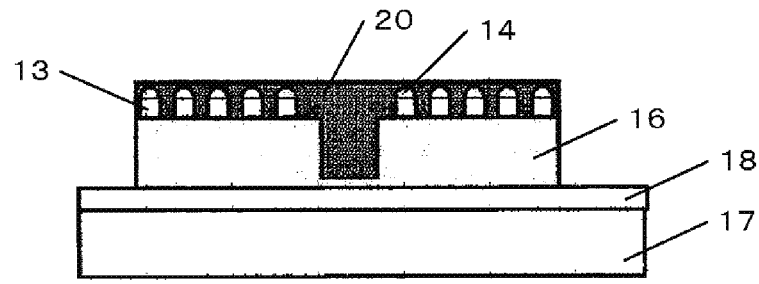
[Figure 8]
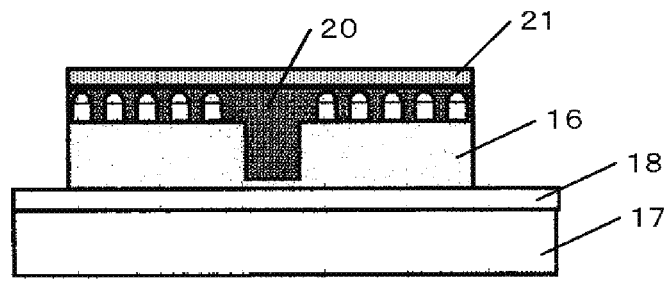

[Figure 9]
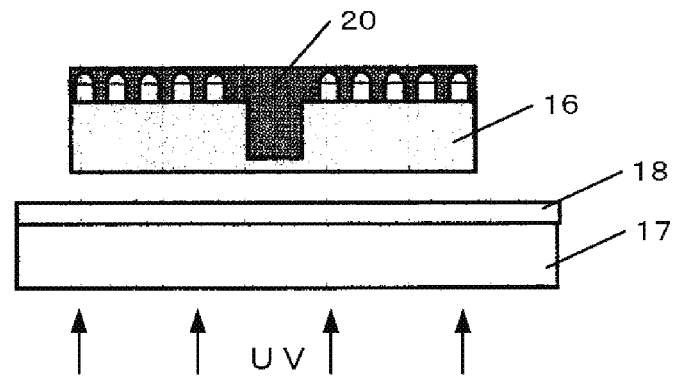
[Figure 10]
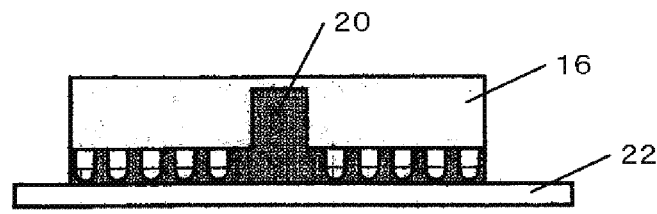
[Figure 11]
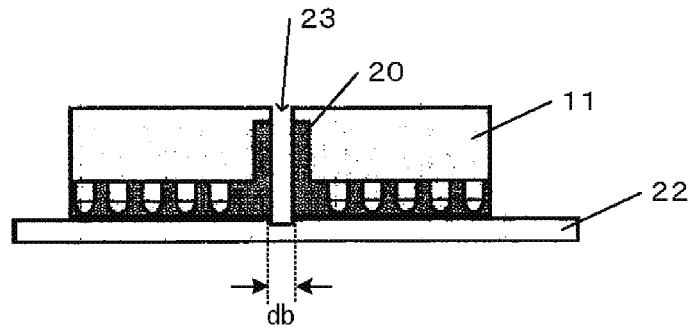

[Figure 12]
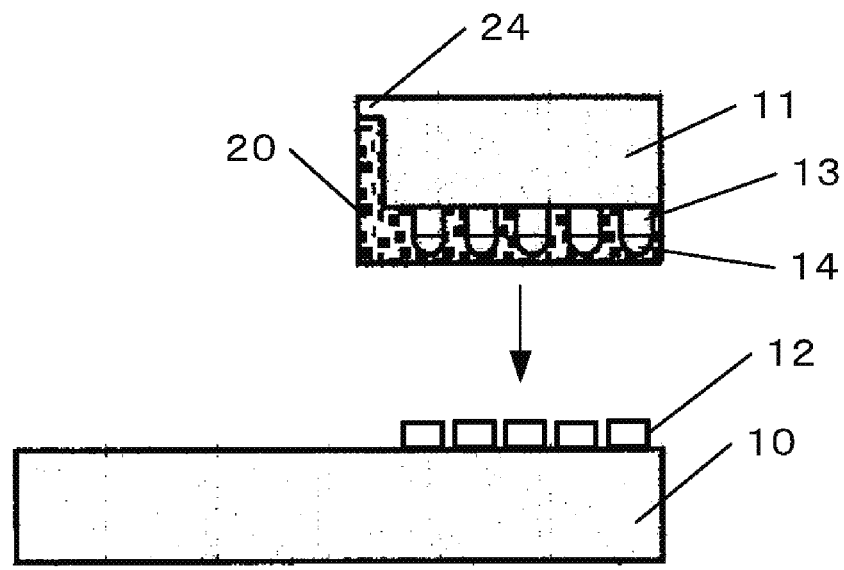
[Figure 13]
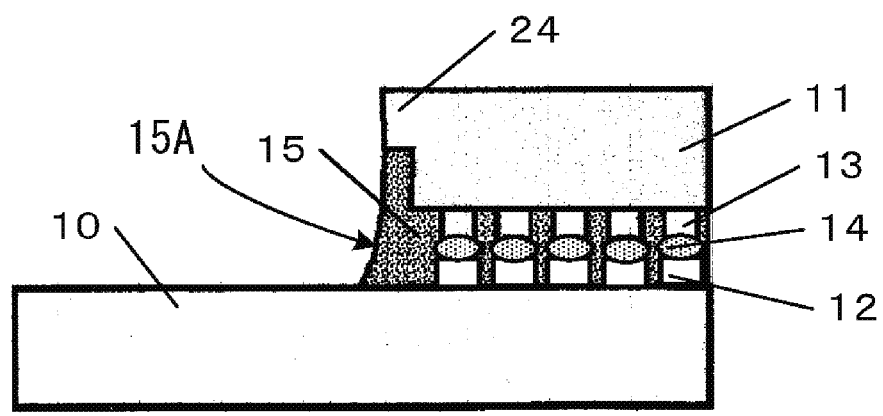

CIRCUIT MODULE AND MANUFACTURING METHOD THEREOF

BACKGROUND

The present invention relates to a circuit module and a manufacturing method thereof, and more specifically, to a circuit module including an underfill at a solder joint section of a substrate and a semiconductor chip, and a manufacturing method thereof.

In the semiconductor packaging technology, highly reliable connection between a semiconductor chip and an organic substrate is made difficult by miniaturization of bumps and weakening of a wiring layer caused by lowered K of a dielectric layer. Generation of a great internal stress caused by different temperature deformations due to the CTE difference between Si (coefficient of thermal expansion (CTE): ~4 ppm) and an organic substrate material (adjusted according to a copper wiring to achieve CTE of about 17 ppm) may be cited as a cause. A fine BEOL or a bump joint may be destroyed by this stress.

Accordingly, strengthening of the structure is performed by injecting an underfill at a bump joint section of a substrate and a semiconductor chip and by hardening the underfill. In this case, a pre-coating method (also referred to as a "no-flow underfill" method) of realizing bump connection in a state where resin is applied in advance on the joining surface may be used (for example, Patent Document 1). This method is gaining attention as a method that is capable of simplifying a process, of reducing the processing time of narrow-gap joining, and of reducing the temperature variation during a process.

However, in the case of using a conventional pre-coating method, a fillet cannot be formed because a sufficient amount of underfill resin is not supplied to corner portions of a semiconductor chip, and this is known to lead to destruction of the joining section. FIG. 1 illustrates an example where an underfill is formed by a conventional pre-coating method. A top view is illustrated in (a), and a side view is illustrated in (b). In the case where a semiconductor chip 91 on which resin is applied in advance is joined to a substrate 90, a sufficient amount of resin is not supplied to corner portions 93 of the semiconductor chip 91, and appropriate fillets (underfills) 92 are not formed at especially the corner portions 93 and their peripheries. In order to prevent this, a method of further applying resin on the corner portions after joining by the pre-coating method is taken, for example, but this increases the number of processes and complicates the processes.

CITATION LIST

Patent Literatures

[Patent Literature 1] JP2001-53109A
[Patent Literature 2] WO2011/129272

BRIEF SUMMARY

Accordingly, the present invention has its aim to solve the conventional problem by proposing a new pre-coating method at the wafer level. That is, the aim of the present invention is to provide a circuit module (a semiconductor device) where a sufficient amount of underfill resin may be supplied to corner portions of a semiconductor chip by the new pre-coating method.

In one mode of the present invention, a circuit module is provided. The circuit module includes (a) a circuit board provided with a plurality of electrode pads on a surface of the circuit board, (b) a semiconductor chip arranged on the circuit board, the semiconductor chip including a front surface and a back surface, where each of a plurality of solder bumps provided on the back surface is solder joined to a corresponding one of the plurality of electrode pads, and (c) an underfill provided between the surface of the circuit board and the back surface of the semiconductor chip. Furthermore, the semiconductor chip includes an eaves portion of a predetermined thickness at an outer periphery of the front surface, and the underfill forms a fillet extending from a bottom surface of the eaves portion to the surface of the circuit board along a side wall of the semiconductor chip.

According to one mode of the present invention, the semiconductor chip includes the eaves portion of a predetermined thickness at the outer periphery of its front surface, and thus the underfill may form a fillet extending from the bottom surface of the eaves portion to the surface of the circuit board along a side wall of the semiconductor chip. As a result, a circuit module where a sufficient amount of underfill resin is supplied even to the corner portions of the semiconductor chip may be provided.

According to one mode of the present invention, the underfill includes a region formed of a thermosetting resin including a low concentration filler and, above the region, a region formed of a thermosetting resin including a high concentration filler.

According to one mode of the present invention, with a thermosetting resin including a low concentration filler and a thermosetting resin including a high concentration filler being stacked together as the underfill, the effect of stress reduction at the corner portions of the semiconductor chip may be increased.

According to one mode of the present invention, a manufacturing method of a circuit module is provided. The manufacturing method includes the steps of:

(a) preparing a semiconductor substrate including a plurality of chip areas, each of the plurality of chip areas including a plurality of solder bumps on a surface;

(b) providing an opening to the semiconductor substrate between adjacent chip areas of the plurality of chip areas, the opening not penetrating the semiconductor substrate;

(c) forming a resin layer on a surface of the semiconductor substrate including the opening;

(d) cutting the semiconductor substrate after formation of the resin layer at a position at substantially a center of the opening, and obtaining, by the cutting, a plurality of semiconductor chips, each including the chip area; and (e) joining the semiconductor chip to a circuit board including a plurality of electrode pads on a surface thereof, where each of the plurality of solder bumps of the semiconductor chip is joined to a corresponding one of the plurality of electrode pads.

According to one mode of the present invention, an eaves portion of a predetermined thickness is formed to an outer periphery of a back surface of the semiconductor chip by the cutting at the position at substantially a center of the opening in the step (d) of cutting. In the subsequent step (e) of heating, a fillet, made of the resin, extending from a bottom surface of the eaves portion of the semiconductor chip to the surface of the circuit board along a side wall of the semiconductor chip is formed. As a result, a circuit module where a sufficient amount of underfill resin is supplied even to the corner portions of the semiconductor chip may be provided.

BRIEF DESCRIPTION OF THE SEVERAL VIEWS OF THE DRAWINGS

FIG. 1 is a diagram illustrating a fillet shape according to a conventional pre-coating method;

FIG. 2 is a diagram illustrating a circuit module of an embodiment of the present invention;

FIG. 3 is a diagram illustrating a flow of a method of an embodiment of the present invention;

FIG. 4 is a cross-sectional view of a process of an embodiment of a method of the present invention;

FIG. 5 is a cross-sectional view of a process of an embodiment of a method of the present invention;

FIG. 6 is a cross-sectional view of a process of an embodiment of a method of the present invention;

FIG. 7 is a cross-sectional view of a process of an embodiment of a method of the present invention;

FIG. 8 is a cross-sectional view of a process of an embodiment of a method of the present invention;

FIG. 9 is a cross-sectional view of a process of an embodiment of a method of the present invention;

FIG. 10 is a cross-sectional view of a process of an embodiment of a method of the present invention;

FIG. 11 is a cross-sectional view of a process of an embodiment of a method of the present invention;

FIG. 12 is a cross-sectional view of a process of an embodiment of a method of the present invention; and FIG. 13 is a cross-sectional view of a process of an embodiment of a method of the present invention.

DETAILED DESCRIPTION

An embodiment of the present invention will be described with reference to the drawings. FIG. 2 is a diagram illustrating a circuit module of an embodiment of the present invention. A cross-sectional view of a circuit module 100 is illustrated in (a), and a part of its top view is illustrated in (b). FIG. 2 is an example where one semiconductor chip 11 is mounted on a circuit board 10. Also, it is needless to say that the structure of the circuit module 100 of the present invention may be applied in the same manner also in a case where two or more semiconductor chips of the same or different sizes are mounted on the circuit board 10. Moreover, the circuit module 100 of the present invention is used in the same sense as a semiconductor device including at least one semiconductor chip.

As the circuit board 10, an arbitrary substrate such as an organic substrate formed of an organic material, a semiconductor substrate of Si or the like, or an insulating substrate of ceramics may be used. An electrical circuit, wiring and the like are formed together with a dielectric material (layer) for separation at least on the surface layer of the circuit board 10. A plurality of electrode pads 12 for connecting to the electrical circuit via wiring are provided on the surface of the circuit board 10. The number of the electrode pads 12 is set to be equal to the number of electrodes (the number of bumps) of a semiconductor chip to be joined. The electrode pad 12 is made of an arbitrary conductive material including at least one metal material such as Cu or Ni, for example.

The semiconductor chip 11 is made of a semiconductor material such as Si, for example. A plurality of electrode sections 13 are formed on the lower surface of the semiconductor chip 11. The plurality of electrode sections 13 are arranged in a lattice (array) when viewed on a plane. The plurality of electrode sections 13 connect to multi-layered wiring layers on the surface layer of the semiconductor chip 11 on the lower surface side, for example. The wiring layers are separated from one another by dielectric layers. The dielectric layer may include a dielectric material having a low dielectric constant (Low-k), for example. Also, the wiring layer may include a metal material, such as Cu, or other conductive material.

Each electrode section 13 is formed of a metal pillar (post) including metal such as Cu or Ni, for example. The metal post 13 is electrically joined (solder joined) to a corresponding electrode pad 12 by a solder 14. The semiconductor chip 11 includes an eaves portion (a protruding portion) indicated by a reference sign 24 at the outer periphery of its upper surface. The eaves portion 24 has predetermined length d1 and thickness t1. One structural feature of the circuit module 100 of the present invention is that the semiconductor chip 11 includes this eaves portion 24.

The joint section of the circuit board 10 and the semiconductor chip 11 is filled with an underfill 15. As illustrated in FIG. 2(a), the underfill 15 fills between the surface of the circuit board 10 and the lower surface of the semiconductor chip 11, and also forms a fillet 15A extending from the bottom surface of the eaves portion 24 to the surface of the circuit board 10 along the side wall of the semiconductor chip 11. Because the semiconductor chip 11 includes the eaves portion 24, a sufficient amount of resin of the underfill 15 is secured at the peripheral portion of the semiconductor chip 11 illustrated in FIG. 2(b), especially at four corner portions A, and the fillet 15A is reliably formed.

As the underfill 15, an arbitrary thermosetting resin material of a uniform filler concentration or two or more thermosetting resin materials of different filler concentrations may be used. For example, in the case where the underfill 15 has a two-layer (region) structure, a thermosetting resin layer including a low concentration filler may be formed on the layer (region) near the surface of the circuit board 10, and a thermosetting resin layer including a high concentration filler may be provided thereon. The low concentration filler here means having a filler density of 50 to 70 percent by weight, for example, and the high concentration filler means having a filler density of 80 to 95 percent by weight, for example. The filler includes a material such as silicon oxide or alumina oxide, for example, and its particle diameter is several to several tens of micrometers ($\mu m$), for example.

With a layered structure where the fillet 15A of the underfill has a different filler concentration in the above manner, the stress at the peripheral portion of the semiconductor chip 11, especially at the corner portions A, may be reduced. The effect of stress reduction is shown in Table 1 below. States 1 to 4 in the table refer to the states of an underfill 15B and the fillet 15A at the side surface of the semiconductor chip 11 indicated below. Also, a lower maximum value (pJ) of elastic strain energy density in the table means lower stress.

State 1: without underfill 15B and fillet 15A

State 2: with underfill 15B, and without fillet 15A

State 3: with underfill 15B and fillet 15A

State 4: with underfill 15B and fillet 15A of two concentrations (two layers)

TABLE 1

| State | Maximum value of elastic strain energy density (pJ) |
|---|---|
| 1 | 2.07 |
| 2 | 1.26 |
| 3 | 1.29 |
| 4 | 0.24 |

As indicated by States 2 to 4 in Table 1, it can be seen that if the underfill 15B and the fillet 15A may be formed at the side surfaces of the semiconductor chip 11 including the corner portions A by the embodiment of the present invention illustrated in FIG. 2, the stress by solder joining of the circuit module can be reduced. Particularly, it can be seen that if, as in State 4, the underfill 15B and the fillet 15A of two concentrations (two layers) are formed, the reduction effect is further increased.

Next, an embodiment of the manufacturing method of the circuit module of the present invention will be described with reference to FIGS. 3 to 13. FIG. 3 is a diagram illustrating a flow of the method of an embodiment of the present invention. FIGS. 4 to 13 are cross-sectional views illustrating respective processes of the embodiment of the method of the present invention. First, a semiconductor substrate is prepared in step S11 in FIG. 3. As illustrated in FIG. 4, a semiconductor substrate 16 includes a plurality of chip areas CA. The chip area CA here means an area that functions as one integrated circuit (IC) after being separated by a later dicing process.

FIG. 4 illustrates only two chip areas CA, but a plurality of chip areas CA are provided in a lattice on the semiconductor substrate 16. A wafer made of a semiconductor material such as Si, for example, corresponds to the semiconductor substrate 16. As illustrated in FIG. 4, each of the plurality of chip areas CA of the semiconductor substrate 16 includes a plurality of solder bumps 13 and 14 on the surface. A solder bump is formed from the metal pillar (post) 13 and a solder layer 14 thereabove. The metal pillar (post) 13 is made of Cu, for example. The solder layer 14 is made of Sn alone, Sn containing at least one metal selected from a group of Ag, Au, Cu, Ni, Bi, In, Zn, Co, Ge, Fe and Ti, or a Pb-free solder metal whose main component is In, for example.

The semiconductor substrate 16 prepared in step S11 in FIG. 3 is joined to a supporting substrate 17 by using an adhesive layer 18, as illustrated in FIG. 5. The supporting substrate 17 is made of silica glass, for example. As the adhesive layer 18, a tape made of a material (resin) that can be attached or detached by ultraviolet light is used, for example. Additionally, the supporting substrate 17 and the adhesive layer 18 are not limited to those mentioned above, and any of materials allowing attachment/detachment of the semiconductor substrate 16 by use of light or heat, or a combination of the materials may be selected.

An opening is formed to the semiconductor substrate in step S12 in FIG. 3. As illustrated in FIG. 6, an opening 19 is formed between two chip areas CA of the semiconductor substrate 16 fixed above the supporting substrate 17. The opening 19 is formed by a dicing device by using a relatively wide blade, for example. The size of the blade is about 100 μm, for example. The opening 19 does not penetrate the semiconductor substrate 16, and a bottom portion of a predetermined thickness t1 is left. This predetermined thickness t1 is the thickness t1 of the eaves portion 24 of the semiconductor chip 11 in FIG. 2 described above.

In step S13 in FIG. 3, a resin layer to be the underfill is formed on the semiconductor substrate. That is, pre-coating by a so-called underfill resin is performed. As illustrated in FIG. 7, a resin layer 20 is formed on the semiconductor substrate 16 including the opening 19. This formation is performed by conventional coating technique (spin coating or the like) and printing technique, for example, and by flattening the surface by a squeegee after application of resin. The resin layer 20 is made of a thermosetting resin material such as epoxy resin, for example.

A second resin layer 21 may also be formed in step S13 above the resin layer 20, as further illustrated in FIG. 8. This second resin layer 21 is formed by an additional selective process. This second resin layer 21 is formed in the case of making the underfill 15 in FIG. 2 described above a two-layer (region) structure. In this case, the second resin layer 21 is made of a thermosetting resin material including a low concentration filler, and the resin layer 20 is made of a thermosetting resin material including a high concentration filler. Additionally, the filler concentration and the material are as described above with respect to the description of FIG. 2.

In step S14 in FIG. 3, the semiconductor substrate 16 is cut. Additionally, step S14 (FIG. 9) and later steps will be described taking as an example a case where only one resin layer 20 in FIG. 7 is formed. The same process may be applied in a case where the two layers, the resin layers 20 and 21, in FIG. 8 are formed. As an advance preparation for cutting of the semiconductor substrate 16, first, the semiconductor substrate 16 is separated from the supporting substrate 17 and the adhesive layer 18. In the case where silica glass and a material (resin) that can be attached or detached by ultraviolet light are used as the supporting substrate 17 and the adhesive layer 18, the semiconductor substrate 16 is separated by radiating ultraviolet light (UV) from the side of the silica glass 17 and detaching the adhesive layer 18 from the semiconductor substrate 16, as illustrated in FIG. 9.

Next, as illustrated in FIG. 10, the separated semiconductor substrate 16 is attached to a dicing tape 22 from the side of the resin layer 20. As the dicing tape 22, a conventional tape that is used for dicing, such as a Si wafer or the like, may be used. After the advance preparation in FIGS. 9 and 10 is performed, the semiconductor substrate 16 is cut, as illustrated in FIG. 11. This cutting is performed in such a way as to form an opening 23 at substantially the center of the portion (the opening 19) that is filled with the resin 20.

The opening 23 is formed by a dicing device by using a relatively narrow blade, for example. The size of the blade is about 50 μm, for example. A plurality of semiconductor chips 11 each including a chip area CA may be obtained by this cutting. FIG. 11 only illustrates the cross-section of each of the two semiconductor chips 11, but square semiconductor chips with four corners, as the semiconductor chip 11 in FIG. 2, may be obtained. Furthermore, the eaves portion 24 is simultaneously formed to the obtained semiconductor chip 11. The length d1 (FIG. 2) of the eaves portion 24 is specified by a width da of the opening 19 in FIG. 6 and a width db of the opening 23 in FIG. 11. That is, the length d1 of the eaves portion 24 may be determined by the following equation:

$$d1 = (da - db)/2.$$

In step S15 in FIG. 3, a circuit board is prepared. Referring to FIG. 12, the circuit board 10 includes a plurality of electrode pads 12 on the surface. Each of the plurality of electrode pads 12 is formed in alignment with each of the plurality of solder bumps 13 and 14. As the circuit board 10, an arbitrary circuit board such as a printed circuit board or a multilayer wiring board may be used, for example.

Next, the circuit board 10 and the semiconductor chip 11 are solder joined in step S16 in FIG. 3. This joining is performed as illustrated in FIGS. 12 and 13 by each of the plurality of solder bumps 13 and 14 of the semiconductor chip 11 being aligned with, and joined to, the corresponding one of the plurality of electrode pads 12 on the surface of the circuit board 10. This solder joining is performed by heating the solder 14 to a temperature of melting. At the same time, the resin of the underfill 15 is melted and liquefied at the heating temperature, and is then polymerized and solidified, and as illustrated in FIG. 13, the gap between the surface of the circuit board 10 and the lower surface of the semiconductor chip 11 is filled with the underfill 15, and the fillet 15A extending from the bottom surface of the eaves portion 24 to the surface of the circuit board 10 along the side wall of the semiconductor chip 11 is formed. As a result, the circuit module 100 in FIG. 2 described above may be obtained.

As described above, a circuit module that is obtained by the manufacturing method of an embodiment of the present invention enables forming of a uniform fillet at the outer periphery of a semiconductor chip, which was difficult with a conventional manufacturing method using the pre-coating method at the wafer level. Also, the circuit module of the present invention is capable of increasing the effect of stress reduction, as indicated by Table 1 described above. Particularly, the stress may be reduced at the corner portions of the semiconductor chip where the stress is concentrated.

Embodiments of the present invention have been described with reference to the drawings. However, the present invention is not limited to these embodiments. The present invention can be carried out in modes where various improvements, modifications, and changes are made based on the knowledge of those skilled in the art without departing from the spirit of the present invention.

REFERENCE SIGNS LIST

10 . . . Circuit board
11 . . . Semiconductor chip
12 . . . Electrode pad
13 . . . Metal pillar (post)
14 . . . Solder layer
15, 15B . . . Underfill
15A . . . Fillet
16 . . . Semiconductor substrate
17 . . . Supporting substrate (silica glass)
18 . . . Adhesive layer (resin tape that can be attached/detached by ultraviolet light)
19, 23 . . . Opening
20, 21 . . . Resin for underfill
22 . . . Dicing tape
24 . . . Eaves portion (protruding portion)

What is claimed is:

1. A circuit module comprising:
   a circuit board provided with a plurality of electrode pads on a surface of the circuit board;
   a semiconductor chip arranged on the circuit board, the semiconductor chip comprising a plurality of solder bumps, a surface and a back surface; and
   an underfill provided between the surface of the circuit board and the back surface of the semiconductor chip, wherein the underfill comprises a first region formed of a first thermosetting resin comprising a low concentration filler in contact with a top surface of the circuit board, and a second region formed of a second thermosetting resin comprising a high concentration filler above and in contact with the first region, the second region extending in a direction perpendicular to the back surface of the semiconductor chip beyond a surface of each solder bump of the plurality of solder bumps, and
   wherein the semiconductor chip comprises an eaves portion, where the underfill forms a fillet extending from and across an entire bottom surface of the eaves portion to the surface of the circuit board.

2. The circuit module according to claim 1, wherein the eaves portion of the semiconductor chip has a length substantially half a size difference between the surface and the back surface of the semiconductor chip.

3. The circuit module according to claim 1, wherein each solder bump of the plurality of solder bump comprises a solder on a metal pillar.

4. The circuit module according to claim 1, wherein the circuit board comprises a copper wiring on an organic substrate.

5. The circuit module according to claim 1, wherein the thermosetting resin comprising the low concentration filler has a filler density of 50 to 70 percent by weight, and the thermosetting resin comprising the high concentration filler has a filler density of 80 to 95 percent by weight.

6. The circuit module according to claim 1, wherein each solder bump of the plurality of solder bumps is solder joined to a corresponding one of the plurality of electrode pads.

7. The circuit module according to 1, wherein only the first region of the first and second regions contacts the top surface of the circuit board.

8. A manufacturing method of a circuit module, comprising at least:
   injecting a first resin layer on a plurality of chip areas on a semiconductor substrate, each chip area comprising a plurality of solder bumps, wherein the first resin layer comprises a high concentration filler, wherein the injecting covers each solder bump of the plurality of solder bumps in their entireties with the first resin layer;
   injecting a second resin layer on and in contact with a surface of the first resin layer, wherein the second resin layer comprises a low concentration filler;
   cutting the semiconductor substrate after injection of the first resin layer and the second resin layer, and obtaining, by the cutting, a plurality of semiconductor chips, each comprising a chip area of the plurality of chip areas, wherein the cutting forms an eaves portion in each semiconductor chip of the plurality of semiconductor chip; and
   forming a fillet made of the first resin layer and the second resin layer extending from across an entire bottom surface of the eaves portion of the semiconductor chip to a surface of a circuit board.

9. The manufacturing method according to claim 8, wherein the injecting covers each solder bump of the plurality of solder bumps in their entireties with the first resin layer such that the first resin layer extends beyond a surface of each solder bump of the plurality of solder bumps.

10. The manufacturing method according to claim 8, wherein the second resin layer is distinct from the first resin layer.

11. The manufacturing method according to claim 8, wherein the manufacturing method further comprises:

providing an opening to the semiconductor substrate between adjacent chip areas of the plurality of chip areas, the opening not penetrating the semiconductor substrate.

12. The manufacturing method according to claim 11, wherein the cutting further comprises:
cutting the semiconductor substrate after injection of the first resin layer and the second resin layer at a position at substantially a center of the opening.

13. The manufacturing method according to claim 8, further comprising:
joining one or more semiconductor chips of the plurality of semiconductor chips to a circuit board comprising a plurality of electrode pads on a surface thereof.

14. The manufacturing method according to claim 13, wherein each of the plurality of solder bumps of the chip area on the semiconductor chip is joined to a corresponding one of the plurality of electrode pads.

15. The manufacturing method according to claim 13, wherein joining the semiconductor chip to a circuit board comprises heating a joining section of the semiconductor chip and the circuit board and forming a solder joint at each of the plurality of electrode pads.

16. The manufacturing method according to claim 15, wherein the fillet is formed during heating of the joining section.

17. The manufacturing method according to claim 8, wherein the eaves portion of the semiconductor chip has a length substantially half a size difference between a front surface and a back surface of the semiconductor chip.

18. The manufacturing method according to claim 8, wherein each solder bump of the plurality of solder bumps comprises a solder on a metal pillar.

19. The manufacturing method according to claim 8, wherein the circuit board comprises a copper wiring on an organic substrate.

20. The manufacturing method according to claim 8, wherein a thermosetting resin comprising the low concentration filler has a filler density of 50 to 70 percent by weight, and a thermosetting resin comprising the high concentration filler has a filler density of 80 to 95 percent by weight.

* * * * *